(12) United States Patent
Aniruddhan et al.

(10) Patent No.: US 7,941,115 B2
(45) Date of Patent: May 10, 2011

(54) MIXER WITH HIGH OUTPUT POWER ACCURACY AND LOW LOCAL OSCILLATOR LEAKAGE

(75) Inventors: Sankaran Aniruddhan, San Diego, CA (US); Bo Sun, Carlsbad, CA (US); Arun Jayaraman, Redwood City, CA (US); Gurkanwal Singh Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 612 days.

(21) Appl. No.: 11/855,997

(22) Filed: Sep. 14, 2007

(65) Prior Publication Data
US 2009/0075689 A1  Mar. 19, 2009

(51) Int. Cl.
*H04B 7/00* (2006.01)
(52) U.S. Cl. ...... 455/258; 455/147; 455/165.1; 331/53; 331/51
(58) Field of Classification Search ........ 455/424, 455/425, 456.5, 456.6, 561, 118, 17, 147, 455/168.1, 183.1, 216, 258; 331/2, 18, 40, 331/43, 108 C, 61; 332/138, 117
See application file for complete search history.

(56) References Cited

U.S. PATENT DOCUMENTS

| | | | |
|---|---|---|---|
| 3,212,024 A * | 10/1965 | King, Jr. ........................ 331/44 |
| 5,930,696 A | 7/1999 | Tzuang et al. |
| 5,966,666 A * | 10/1999 | Yamaguchi et al. ....... 455/552.1 |
| 6,016,422 A * | 1/2000 | Bartusiak ........................ 455/76 |
| 6,259,301 B1 | 7/2001 | Gailus et al. |
| 6,307,894 B2 * | 10/2001 | Eidson et al. ............... 375/297 |
| 6,487,398 B1 * | 11/2002 | Nobbe et al. ................. 455/118 |
| 6,590,438 B1 | 7/2003 | Manku et al. |
| 6,906,996 B2 | 6/2005 | Ballantyne |
| 6,985,033 B1 * | 1/2006 | Shirali et al. ................ 330/149 |
| 7,023,275 B2 | 4/2006 | Miyamoto |

(Continued)

FOREIGN PATENT DOCUMENTS
EP  1521376  4/2005
(Continued)

OTHER PUBLICATIONS

Brenna G et al: "A 2GHz Carrier Leakage Calibrated Direct-Conversion WCDMA Transniitter in 0.13-<tex> $muhboxrn$,/tex.CMOS" IEEE Hournal of Solid-State Circuits,. IEEE vol. 39, No. 8, Aug. 1, 2004, pp. 1253-1262; XP011115212.
(Continued)

*Primary Examiner* — Duc Nguyen
*Assistant Examiner* — Charles Chow
(74) *Attorney, Agent, or Firm* — Jiayu Xu

(57) ABSTRACT

A circuit receives a first signal (for example, a baseband signal) and mixes it with a local oscillator (LO) signal, and outputs a second signal (for example, an RFOUT signal). The circuit includes multiple identical Mixer and Frequency Divider Pair (MFDP) circuits. Each MFDP can be enabled separately. Each MFDP includes a mixer and a frequency divider that provides the mixer with a local version of the LO signal. The MFDP outputs are coupled together so that the output power of the second signal (RFOUT) is the combined output powers of the various MFDPs. By controlling the number of enabled MFDPs, the output power of the second signal is controlled. Because the MFDPs all have identical layouts, accuracy of output power step size is improved. Because LO signal power within the circuit automatically changes in proportion to the number of enabled MFDPs, local oscillator leakage problems are avoided.

21 Claims, 7 Drawing Sheets

U.S. PATENT DOCUMENTS

| | | | |
|---|---|---|---|
| 7,076,231 | B2 | 7/2006 | Yamawaki et al. |
| 7,092,676 | B2 * | 8/2006 | Abdelgany et al. ............. 455/76 |
| 7,139,547 | B2 | 11/2006 | Wakayama et al. |
| 7,151,919 | B2 | 12/2006 | Takalo et al. |
| 7,277,689 | B2 | 10/2007 | Simon |
| 7,778,613 | B2 | 8/2010 | Seendripu et al. |
| 2004/0127172 | A1 | 7/2004 | Gierkink et al. |
| 2005/0107055 | A1 | 5/2005 | Bult et al. |
| 2005/0282512 | A1 | 12/2005 | Yu |
| 2006/0009171 | A1 * | 1/2006 | Xu et al. ..................... 455/114.2 |
| 2006/0068746 | A1 | 3/2006 | Feng et al. |
| 2006/0246862 | A1 | 11/2006 | Agarwal et al. |
| 2007/0026832 | A1 * | 2/2007 | Someya ........................ 455/263 |
| 2007/0142080 | A1 * | 6/2007 | Tanaka et al. ............. 455/552.1 |
| 2007/0247212 | A1 | 10/2007 | Zhang |
| 2007/0298750 | A1 | 12/2007 | Masuda |
| 2008/0125060 | A1 * | 5/2008 | Lin et al. ...................... 455/126 |
| 2009/0023413 | A1 | 1/2009 | Xu et al. |

FOREIGN PATENT DOCUMENTS

| | | |
|---|---|---|
| EP | 1760877 A1 | 3/2007 |
| EP | 1833161 | 9/2007 |
| WO | 9726710 | 7/1997 |
| WO | WO2006117589 | 11/2006 |
| WO | 2007053365 | 5/2007 |

OTHER PUBLICATIONS

International Search Report—PCT/US08/076321, International Search Authority—European Patent Office—Jan. 7, 2009.

Written Opinion—PCT/US08/076321, International Search Authority—European Patent Office—Jan. 7, 2009.

International Search Report—PCT/US08/076324, International Search Authority—European Patent Office—Jan. 7, 2009.

Written Opinion—PCT/US08/076324, International Search Authority—European Patent Office—Jan. 7, 2009.

Farbod Behbahani et al: "A 2.4-GHz Low-IF Receiver for Wideband WLAN in 0.6-m CMOS-Architecture and Front-End" IEEE Journal of Solid-State Circuits, IEEE Service Center, Piscataway, NJ, US, vol. 35, No. 12, pp. 1908-1916 Dec. 1, 2000, XP011061384 ISSN: 0018-9200 section IV B figure 8a.

Kim, Bonkee et al: "A 2.6 V GSM/PCN Dual Band Variable Gain Low Noise RF Down Conversion Mixer" 2002 IEEE Radio Frequency Integrated Circuits Symposium, 2002, pp. 137-140, XP002508867 sections II and III figures 1-3.

Mayer C et al: "A Robust GSM/EDGE Transmitter Using Polar Modulation Techniques" Wireless Technology, 2005. The European Conference on CNIT LA Defense, Paris Oct. 3-4, 2005, Piscataway, NJ, USA,IEEE LNKDDOI: 10.1109/ECWT.2005.1617663, Oct. 3, 2005, pp. 103-106, XP010908871 ISBN: 978-2-9600551-1-5 figure 2.

Mccune E Ed—Maxim A: "Polar modulation and bipolar RF power devices" BIPOLAR/BICMOS Circuits and Technology Meeting, 2005. Proceedings of the, IEEE, Piscataway, NJ, USA LNKDDOI: 10.1109/BIPOL..2005.1555188, Oct. 9, 2005, pp. 1-5, XP010861821 ISBN: 978-0-7803-9309-7 figure 2.

Ziv R et al: "A phase correction technique applied to 700MHz a 6GHz complex demodulators in multi-band wireless systems" Microwaves, Communications, Antennas and Electronic Systems, 2008. C0MCAS 2008. IEEE International Conference on, IEEE, Piscataway, NJ, USA, May 13, 2008, pp. 1-8, XP031285336 ISBN: 978-1-4244-2097-1 the whole document.

* cited by examiner

| | CONVENTIONAL ARCHITECTURE (FIGURES 1-3) | NOVEL ARCHITECTURE (FIGURES 4-7) | UNITS |
|---|---|---|---|
| ACCURACY OF POWER CONTROL | 0.25 TO 0.5 dB OF ERROR | LESS THAN 0.25 dB OF ERROR | dB |
| COMPOSITE LO POWER | REMAINS CONSTANT WITH OUTPUT POWER | DECREASES dB FOR dB WITH OUTPUT POWER | |
| LO LEAKAGE | -5 TO -10 | <-30 | dBC |

MIXER WITH HIGH OUTPUT POWER ACCURACY AND LOW LOCAL OSCILLATOR LEAKAGE

BACKGROUND INFORMATION

1. Technical Field

The disclosed embodiments relate to local oscillators and mixers.

2. Background Information

FIG. 1 (Prior Art) is a very simplified high level block diagram of circuitry of a cellular telephone 1. Cellular telephone 1 includes an antenna 2, several discrete components, and several integrated circuits including a radio frequency (RF) transceiver integrated circuit 3 and a digital baseband integrated circuit 4. Digital baseband integrated circuit 4 includes primarily digital circuitry and includes a digital processor. RF transceiver integrated circuit 3 includes primarily analog circuitry. RF transceiver integrated circuit 3 is called a "transceiver" because it includes a transmitter as well as a receiver.

FIG. 2 (Prior Art) is a more detailed diagram of the RF transceiver integrated circuit 3 of FIG. 1. The receiver includes what is called a "receive chain" 5 as well as a local oscillator (LO) 6. When the cellular telephone 1 is receiving, a high frequency RF signal 7 is received on antenna 2. Information from signal 7 passes through the receive chain 5 to the digital baseband integrated circuit 4. If the cellular telephone is transmitting, then information to be transmitted is converted into analog form by a digital-to-analog converter in the digital baseband integrated circuit 4. Baseband filter 8 in transmit chain 9 filters out digital noise. Mixer block 10 up-converts the low frequency signal from baseband filter 8 into a high frequency signal. Driver amplifier 11 and power amplifier 12 amplify the high frequency signal to drive antenna 2 so that high frequency RF signal 13 is transmitted from antenna 2.

The cellular telephone 1 of FIGS. 1 and 2 may be a type of cellular telephone that is sometimes referred to as a "3G" cellular telephone. The 3G cellular telephone can be used to transfer data in addition to communicating speech conversations. An example of transferring data is browsing the internet. A typical 3G cellular telephone communication standard (for example, Wideband Code-Division Multiple Access (WCDMA)) requires that the cellular telephone be able to control the magnitude of RF output power with which the cellular telephone transmits to a base station. Accordingly, digital baseband integrated circuit 4 within cellular telephone 1 is able control the RF transceiver integrated circuit 3 such that the power of the transmitted RF signal 13 has a specified one of a plurality of discrete "steps" or "levels" of output power. The 3G cellular telephone standard generally specifies the lowest output power level that may be used, specifies the maximum output power level that may be used, and specifies a number of steps of selectable output power levels in between the minimum and maximum output power levels. The power levels are be repeatable over all phones manufactured.

In the cellular telephone 1 of FIGS. 1 and 2, transmit output power is a function of the operation of baseband filter 8, mixer block 10, and driver amplifier 11. The digital baseband integrated circuit 4 can therefore control the magnitude of transmit output power by controlling the baseband filter, mixer block, and/or driver amplifier using control lines 14-16.

FIG. 3 (Prior Art) is a more detailed diagram of a portion of FIG. 2. If, for example, baseband filter 8 is outputting a 1 MHz baseband signal 17, and it is desired to up-convert this baseband signal in frequency into a 901 MHz high frequency output signal 18, then local oscillator 19 is controlled to output a 900 MHz local oscillator signal 20. Baseband processor integrated circuit 4 controls the frequency of the local oscillator signal 20 and is therefore able to control the frequency of the high frequency output signal 18 that drives driver amplifier 11.

One operational parameter of the circuitry of FIG. 3 is the accuracy with which the output power of signal 18 can be controlled. Mixer block 10 actually includes multiple mixers 21-23 that are connected together in parallel as shown. The size of a mixer determines the power that the mixer can output. The various mixers 21-23 are sized in a binary weighted manner so that each successive mixer is double the size of the prior mixer. The output powers of all the mixers 21-23 are combined in a primary winding 24 of a transformer 25 so that driver amplifier 11 is driven by the combined power of all the mixers that are enabled. Due to the binary weighting of the sizes of mixers 21-23, the power of signal 18 can be set to have an output power in any one of eight power steps 0X to 7X by enabling and disabling selected ones of mixers 21-23. Every doubling of the output power increases the output power by 6 dB.

Mixers 21-23 are realized as separate mixers on the RF transceiver integrated circuit 3 where each successive mixer is twice the size of the prior mixer. It would be expected that a second mixer that is twice the size of a first mixer would have an output power that is twice as great as the output power of the smaller first mixer. In reality, however, there may be somewhat complex high frequency parasitic effects due to differences in the physical structures that make up the various mixers and due to interactions between adjacent physical structures. The impact of these parasitic effects on mixer output power generally does not scale with mixer size. Accordingly, the enabling and disabling of mixers whose sizes are binary weighted does not always result in adequate accuracy of the power of the output power steps.

A second operational parameter of the circuitry of FIG. 3 is local oscillator leakage. In the illustrated example in which the baseband signal 17 is a pure 1 MHz signal and the local oscillator signal 20 is a pure 900 MHz signal, then the high frequency output signal 18 is a pure 901 MHz signal. In an ideal case, the output of mixer block 10 in this case will not include any of the 1 MHz baseband signal and will not include any of the 900 MHz local oscillator signal. In reality, however, mixer block 10 outputs the desired 901 MHz signal but also outputs some amount of a signal at 900 MHz. The 900 MHz signal is said to be "leakage" from the local oscillator. Once the 900 MHz signal gets to the transformer 25, the 900 MHz signal is amplified by driver amplifier 11 and power amplifier 12 and is transmitted from antenna 2. This is undesirable. There is a relationship between the amount of power with which local oscillator 19 drives mixer block 10, and the loading on the output of the local oscillator due to which ones of the mixers 21-23 within mixer block 10 are enabled. If transmitter output power is to be reduced and the combined size of the enabled mixers in mixer block 10 is reduced, then local oscillator leakage may increase as a proportion of the desired high frequency signal 18 because the local oscillator 19 continues to drive the mixer block 10 with the same power even though the loading presented by the mixer block 10 has been reduced. Moreover, there is leakage through mixers that are not enabled, so the amount of leakage does not track well with the output power supplied by the mixers. Cellular telephone standards generally specify that the power of local oscillator leakage be below the output power of the RF output signal by a certain amount. When digital baseband integrated circuit 4 controls the RF transceiver integrated circuit 3 to reduce the output power of the desired signal, local oscillator leakage should also be reduced a proportional amount in order to remain within the requirements of the cellular telephone standard. In the circuit topology of FIG. 3, however, the reduction in local oscillator leakage may not track with the reduction in output power of the desired output signal 18 in a suitable manner.

SUMMARY

A novel mixer circuit receives a first signal (for example, a baseband signal) and mixes it with a local oscillator (LO) signal, and outputs a second signal (for example, an RFOUT signal). The mixer circuit includes multiple identical Mixer and Frequency Divider Pair (MFDP) circuits. Each MFDP includes a mixer and an associated frequency divider that provides the mixer with a local version of the local oscillator signal. All the local versions together constitute what is referred to here as the "local oscillator signal" or the "composite local oscillator signal".

Each MFDP can be enabled separately. If an MFDP is disabled, not only is its mixer disabled, but its frequency divider is also disabled so that the local version of the local oscillator signal is not generated. A single frequency synthesizer supplies a drive signal to the frequency dividers of all the MFDPs so that the frequency divider can, if the MFDP is enabled, generate the local version of the local oscillator signal. In one example, a baseband processor integrated circuit within a cellular telephone controls the frequency synthesizer to change the frequency of the drive signal output by the frequency synthesizer. By changing the frequency of the drive signal, the baseband processor integrated circuit can change the frequency of the second signal (RFOUT).

The outputs of the MFDPs are coupled together so that the combined output power of the second signal (for example, RFOUT) is the combined power of the output signals of the various MFDPs. (In one example, the power of a signal is determined by multiplying the RMS voltage by the RMS current of the signal.) By controlling the number of MFDPs that are enabled, the output power of the second signal is controlled to have an output power that is a selected one of a plurality of discrete output power values. The discrete output power values may be referred to as output power "steps" or "levels". Because the MFDPs are substantially identical circuits and all have substantially identical layouts, accuracy and repeatability of the output power levels and step size are improved. Because the power of the composite local oscillator signal within the novel mixer circuit is automatically changed in proportion to the number of MFDPs enabled, local oscillator signal leakage problems are avoided. The power of local oscillator signal leakage scales with the power of the desired second signal.

The foregoing is a summary and thus contains, by necessity, simplifications, generalizations and omissions of detail; consequently, those skilled in the art will appreciate that the summary is illustrative only and does not purport to be limiting. Other aspects, inventive features, and advantages of the devices and/or processes described herein, as defined solely by the claims, will become apparent in the non-limiting detailed description set forth herein.

DETAILED DESCRIPTION

Figure 4:
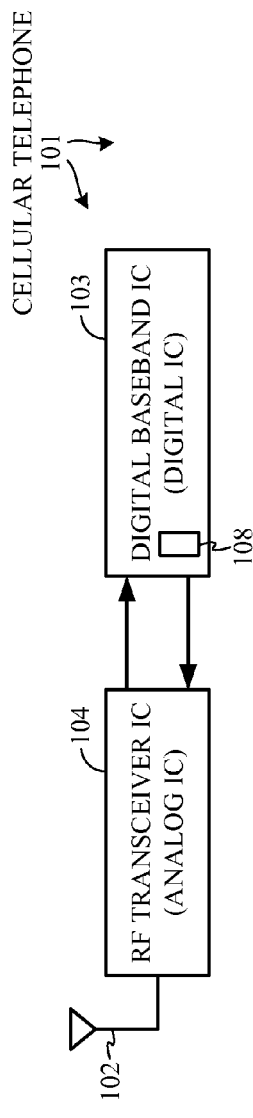
FIG. 4 is a very simplified high level block diagram of circuitry of one particular type of cellular telephone 101 in accordance with one novel aspect.

FIG. 4 is a very simplified high level block diagram of circuitry of one particular type of cellular telephone 101 in accordance with one novel aspect. In this example, cellular telephone 101 is a 3G cellular telephone that uses the WCDMA cellular telephone communication protocol. Cellular telephone 101 includes an antenna 102, several discrete components, and several integrated circuits including two integrated circuits 103 and 104. Integrated circuit 103 is called a digital baseband integrated circuit or a baseband processor integrated circuit. Integrated circuit 103 includes primarily digital circuitry and includes a digital processor. Integrated circuit 104 is called a radio frequency (RF) transceiver integrated circuit. RF transceiver integrated circuit 104 includes primarily analog circuitry. RF transceiver integrated circuit 104 is called a "transceiver" because it includes a transmitter as well as a receiver. The receiver includes a local oscillator (LO) 106 and circuitry that is called a "receive chain" 105. When the cellular telephone 101 is receiving, a high frequency RF signal 107 is received on antenna 102. Information from signal 107 passes through the receive chain 105 to the digital baseband integrated circuit 103. If the cellular telephone is transmitting, then baseband data to be transmitted is converted into analog form by a digital-to-analog converter 108 (see FIG. 4) in the digital baseband integrated circuit 103. A baseband filter 109 in the transmit chain 110 filters out digital noise in this analog baseband signal. A local oscillator 111 supplies a local oscillator signal to a mixer block 112 in transmit chain 110. Mixer block 112 up-converts the filtered low frequency analog baseband signal into a high frequency signal. Driver amplifier 113 and power amplifier 114 amplify the high frequency signal to drive antenna 102 so that a high frequency radio frequency RF signal 115 is transmitted from antenna 102.

Figure 5:
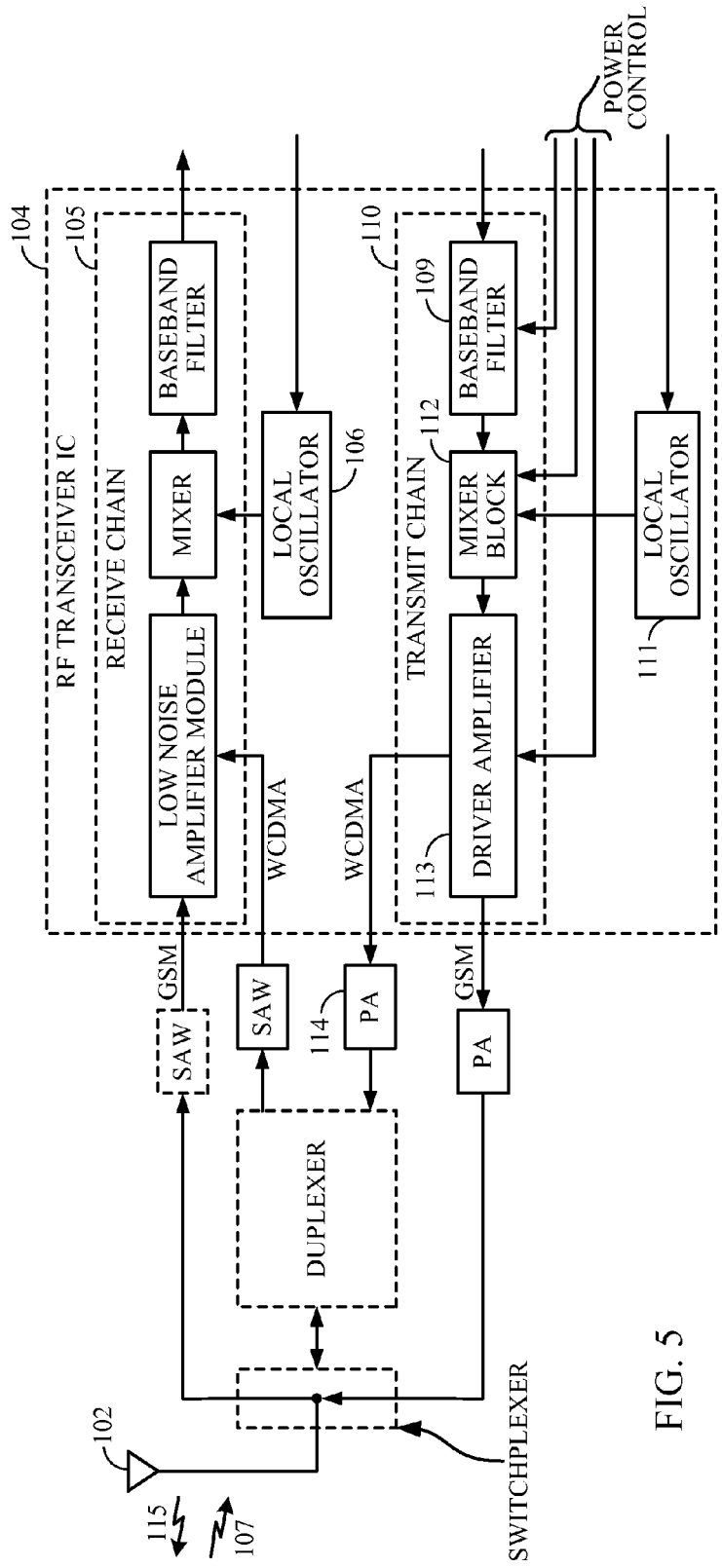
FIG. 5 is a more detailed diagram of the RF transceiver integrated circuit 104 of FIG. 4.
Figure 6:
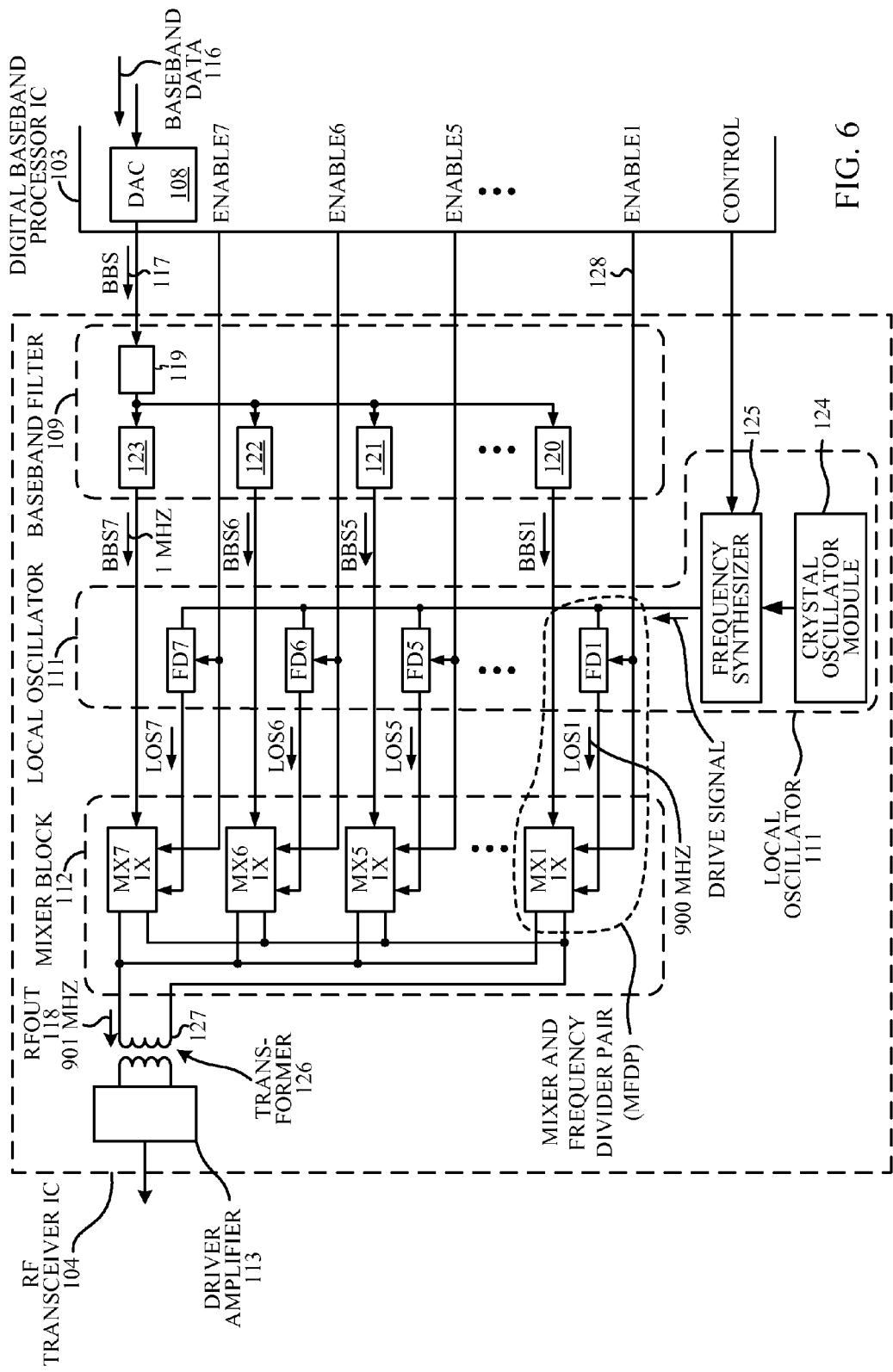
FIG. 6 is a more detailed diagram of the transmit chain within the RF transceiver integrated circuit 104 of FIG. 4.

FIG. 6 is a more detailed diagram of selected parts of the RF transceiver integrated circuit 104 of FIG. 5. Baseband data 116 is converted into an analog input baseband signal BBS 117 by digital-to-analog converter 108 in the digital baseband processor integrated circuit 103. BBS 117 is up-converted in frequency into an output signal RFOUT 118. BBS 117 is at baseband frequencies such as, for example, 1 MHz. RFOUT 118 is at higher frequencies referred to as RF frequencies. In the present example, the RF frequency is 901 MHz.

Baseband filter 109 removes images and noise introduced by the digital-to-analog conversion process and outputs a plurality of filtered baseband signals BBS1-BBS7. Baseband filter 109 includes a first stage 119 and a plurality of second stages 120-123. The first stage includes the filter that filters out noise due to the digital-to-analog conversion process. Each of the second stages includes a precision current mirror that isolates the output of the first stage from each of the seven outputs of the second stages. In the present example, all the filtered baseband signals BBS1-BBS7 are substantially identical signals of the same 1 MHz frequency.

Local oscillator 111 includes a crystal oscillator module 124, a frequency synthesizer 125, and a plurality of frequency dividers FD1-FD7. Each of the frequency dividers FD1-FD7 outputs a local version of a local oscillator signal. The frequencies of the local versions of the local oscillator signal is controlled by the digital baseband processor integrated circuit 103. The first frequency divider FD1, for example, outputs the local oscillator signal denoted LOS1 in FIG. 6; and the second frequency divider FD2, for example, outputs the local oscillator signal denoted LOS2 in FIG. 6; and so forth. Local oscillator 111 therefore outputs a plurality of local oscillator signals LOS1-LOS7. The frequencies of all these signals LOS1-LOS7 are identical. In the illustrative example of FIG. 6, this frequency is 900 MHz.

Figure 7:
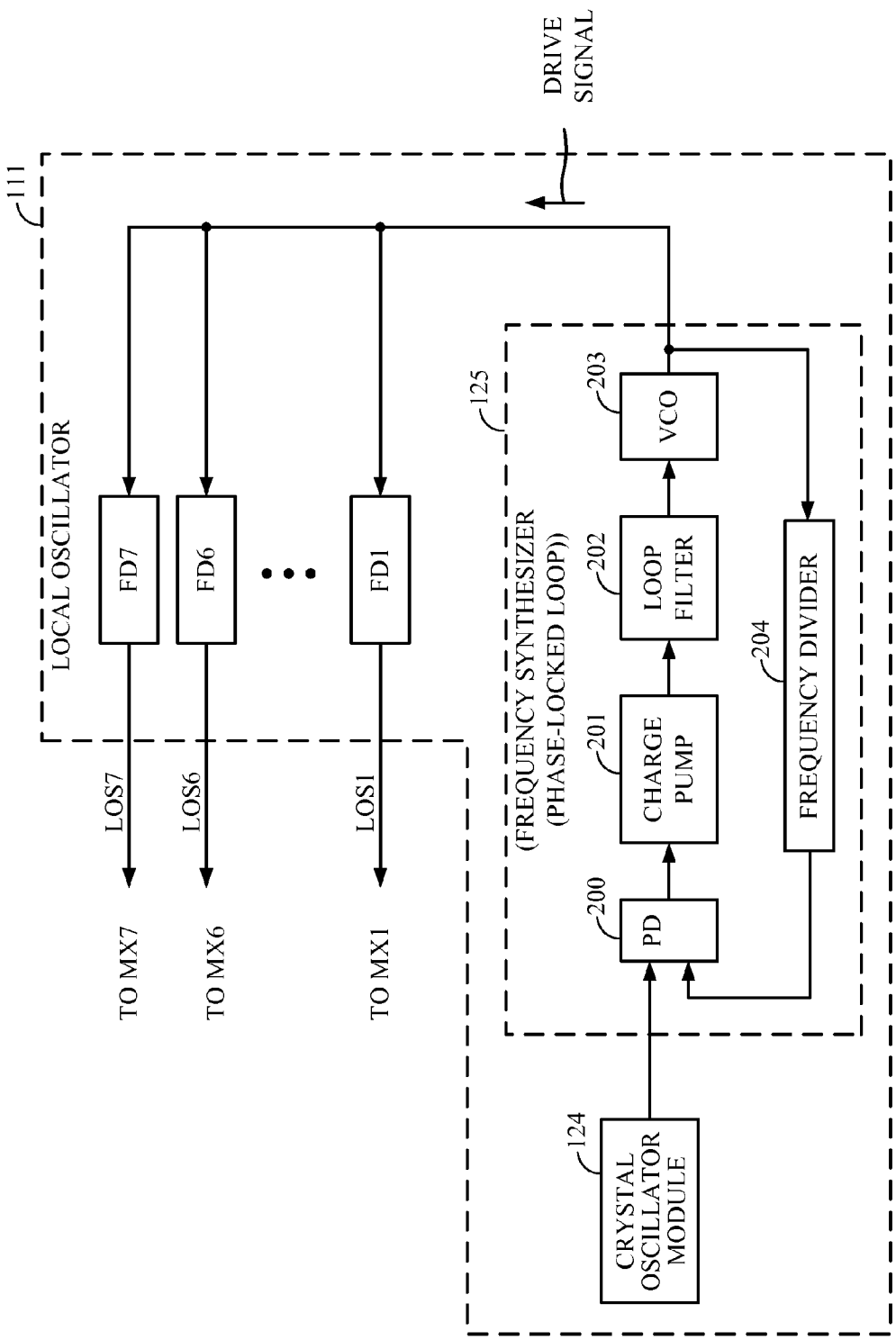
FIG. 7 is a more detailed diagram showing one way that the local oscillator 111 of FIG. 6 can be realized.

FIG. 7 is a more detailed diagram of local oscillator 111. Frequency synthesizer 125 is an analog phase-locked loop that includes a phase detector 200, a charge pump 201, a loop filter 202, a voltage controlled oscillator 203, and a frequency divider 204. It is to be understood, however, that the phase-locked loop circuit illustrated in FIG. 7 is just one suitable way to realize frequency synthesizer 125. In another example, frequency synthesizer 125 is realized using a digital phase locked loop circuit.

As illustrated in FIG. 6, mixer block 112 includes a plurality of identical mixers MX1-MX7. The "1X" label in a mixer block in FIG. 6 indicates the size of the mixer. Each mixer receives a local oscillator signal from a corresponding one of the frequency dividers of local oscillator 111. For example, mixer MX1 receives local oscillator signal LOS1 from frequency divider FD1. Each mixer also receives a filtered baseband signal from a corresponding one of the second stages of baseband filter 109. For example, mixer MX1 receives baseband signal BBS1 from second stage 120 of baseband filter 109. The mixers operate to up-convert their respective baseband signals to the higher RF frequency. The output leads of mixers MX1-MX7 are all coupled together as illustrated so that their output signals together are the RFOUT signal 118. Signal RFOUT 118 from mixer block 112 drives the driver amplifier 113 through transformer 126. Signal RFOUT 118 flows through the primary 127 of transformer 126. The power with which driver amplifier 113 is driven is directly proportional to the combined powers of the signals output by the various mixers MX1-MX7. There are several ways of determining the power of a signal. In the present example, the power of RFOUT signal 118 is determined by multiplying the RMS current of signal 118 by the RMS voltage of signal 118.

Each mixer and its associated frequency divider is referred to as a "Mixer and Frequency Divider Pair" (MFDP). For example, mixer MX1 and frequency divider FD1 together are a first MFDP. There are seven such identical MFDPs in the example of FIG. 6. Each of the seven MFDPs can be enabled or disabled independently of the enabling or disabling of each of the other of the MFDPs. In the illustrated example, each MFDP has its own associated enable input conductor (i.e., enable line). For example, enable input conductor 128 is the enable input conductor for the first MFDP made up of mixer MX1 and frequency divider FD1. Digital baseband processor integrated circuit 103 can control the number of MFDPs that are enabled by driving appropriate digital signals onto the enable input conductors of the MFDPs.

There are many ways that the digital baseband processor integrated circuit 103 can communicate power control information to RF transceiver integrated circuit 104 to effectuate the enabling and disabling of MFDPs. The use of multiple different enable signals ENABLE1-ENABLE7, each communicated on a different enable input conductor between the baseband processor 103 and the RF transceiver 104, is just one way that the power control information can be communicated. In another example, the control information is communicated from the baseband processor 103 to the RF transceiver 104 in serial fashion across a serial bus, and the information is then received and converted in the RF transceiver 104 into parallel form that in turn controls the number of MFDPs that are enabled. Regardless of how the power control information is communicated, by controlling the number of MFDPs that are enabled, the power with which mixer block 112 drives driver amplifier 113 can be controlled to have one of eight discrete power values. These discrete power values may be referred to as power "steps" or "levels". The digital baseband processor integrated circuit 103 may cause the power of RFOUT 118 to be stepped up, or stepped down, within an output power range by appropriate enabling or disabling of the MFDPs.

Figure 1:
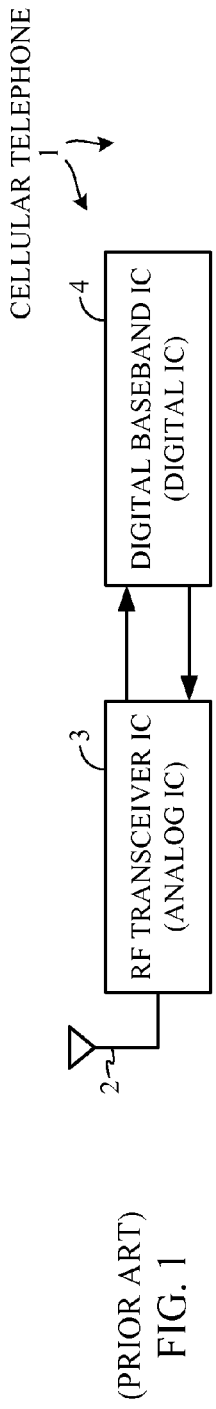
FIG. 1 (Prior Art) is a high level diagram of circuitry in a conventional cellular telephone.
Figure 2:
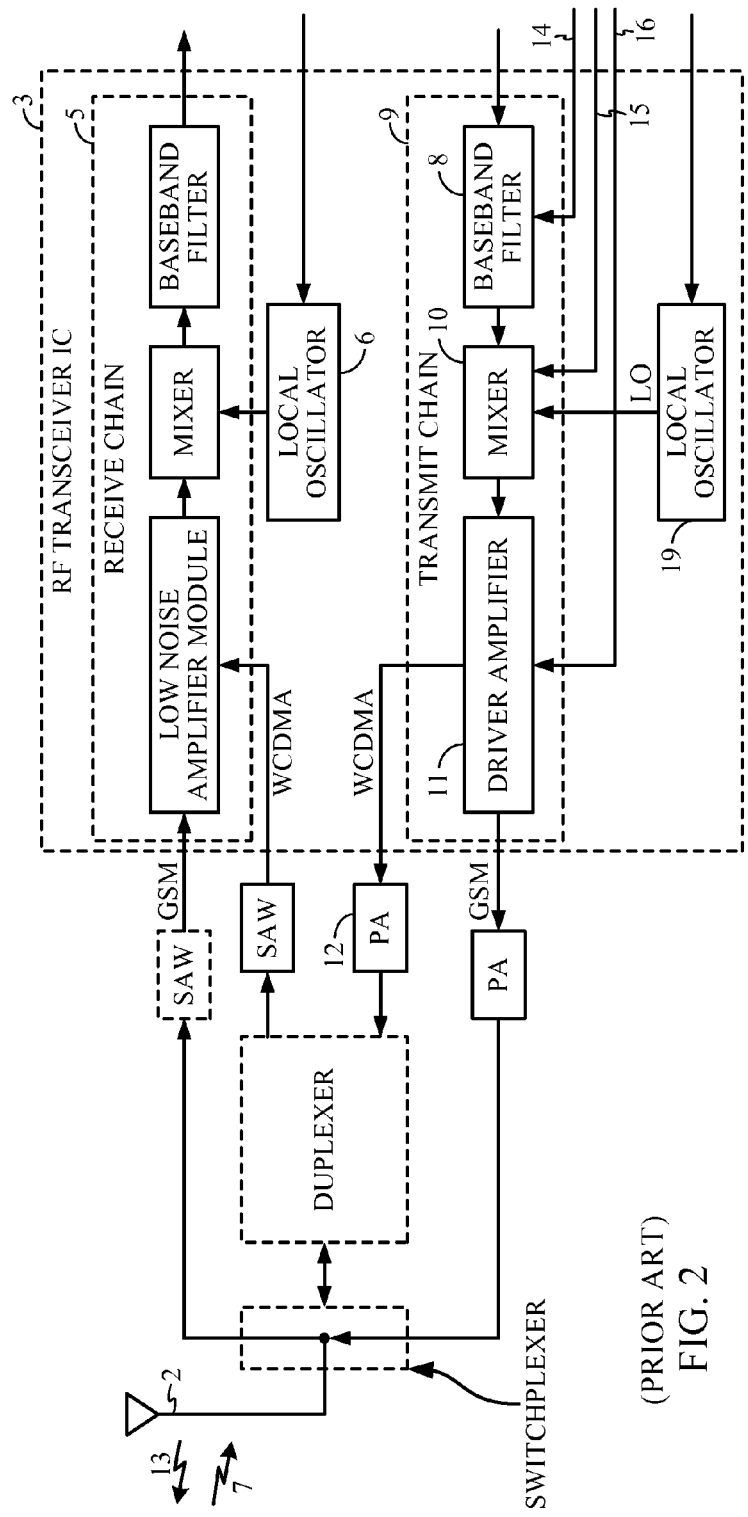
FIG. 2 (Prior Art) is a more detailed diagram of the circuitry of FIG. 1.
Figure 3:
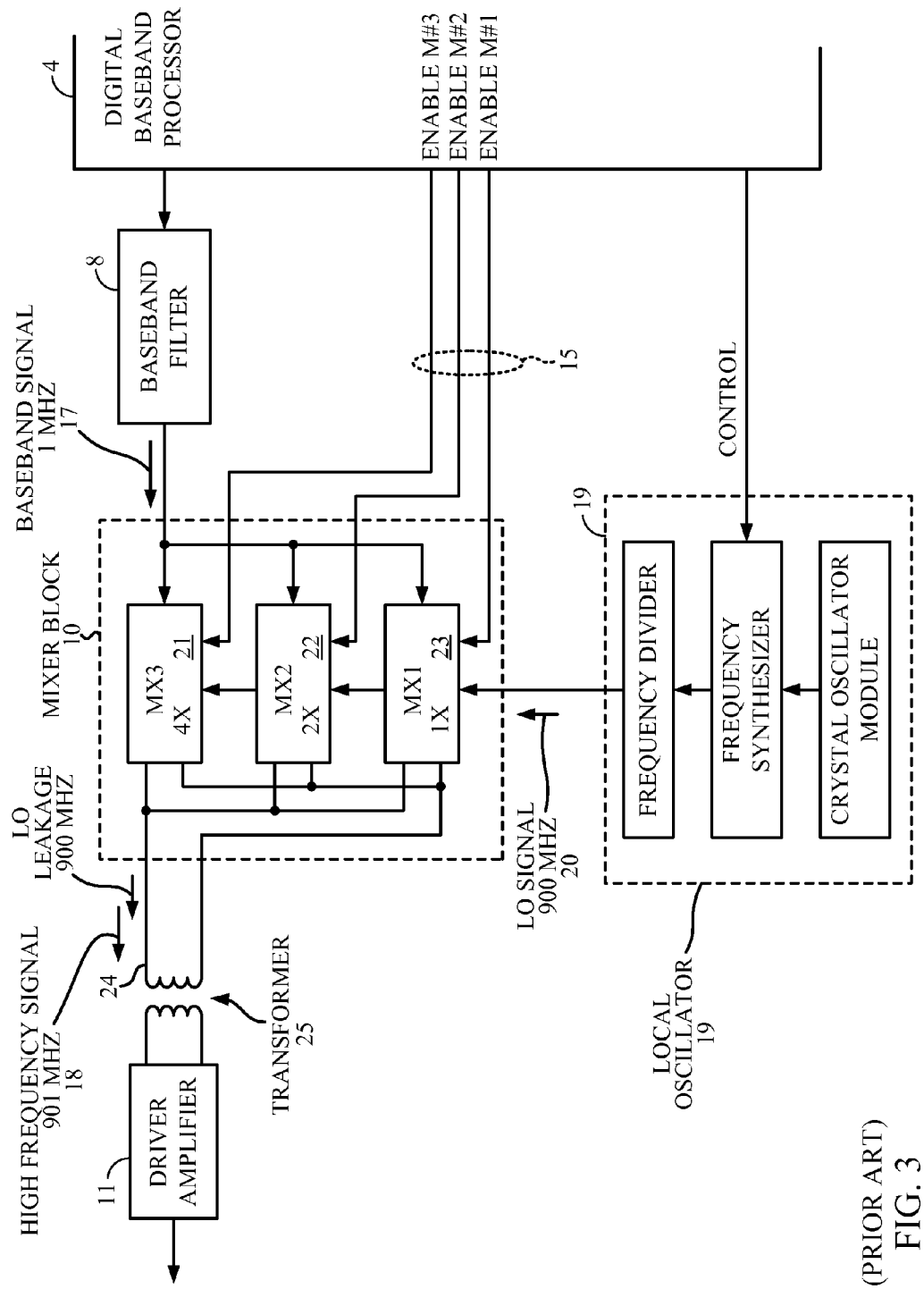
FIG. 3 (Prior Art) is a more detailed diagram of the mixer block within the circuitry of FIG. 2.

In the prior art example of FIG. 3, the mixers MX1-MX3 are of different sizes. As set forth above, even though mixer MX2 may be made to be twice as large as mixer MX1, the output power provided by mixer MX2 may not, due to parasitics and complex interactions of signals and structures, be precisely twice as large as the output power provided by mixer MX1. Accordingly, RF output power step size of the overall circuit is somewhat inaccurate. The various power steps are not all of the same size. In the novel circuit of FIG. 6, on the other hand, the seven MFDPs are all identical structures and have identical layouts. The mixers MX1-MX7 are all identical structures and have identical layouts. Accordingly, the output power provided by an enabled MFDP is substantially equal to the output power provided by each other enabled MFDP. Because the output power of each MFDP, if enabled, is substantially identical to the output power of each other enabled MFDP, the accuracy and repeatability of the output power levels are improved in comparison to the accuracy and repeatability of the output power levels of the prior art circuit of FIG. 3.

Not only is the accuracy of the output power levels improved, but also the local oscillator leakage of the novel circuit of FIG. 6 is improved in comparison to the local oscillator leakage of the prior art circuit of FIG. 3. In the prior art circuit of FIG. 3, the local oscillator 19 supplies a single local oscillator signal to mixer block 10. The power of the single local oscillator signal remains constant and is not changed even though the number of mixers within mixer block 10 that are enabled may be changed over time to change transmitter output power. Accordingly, as transmitter output power is changed, the loading on the local oscillator changes, and the ratio of the power of local oscillator leakage that passes through mixer block 10 to the power of the desired RF output signal changes. Moreover, there is some local oscillator leakage through a disabled mixer, so local oscillator leakage does not scale with the output power of the circuit as the various mixers are enabled and disabled.

In the novel circuit of FIG. 6, on the other hand, the total local oscillator signal power is the combined power of the seven local oscillator signals LOS1-LOS7. The power of the combined local oscillator signal is therefore made to vary with the number of MFDPs that are enabled. Increasing the number of enabled MFDPs serves to increase the combined power of the local oscillator signal by a proportionate amount. Decreasing the number of enabled MFDPs serves to decrease the combined power of the local oscillator signal by a proportionate amount. Because leakage through mixer block 112 is related to the combined power of the local oscillator signals LOS1-LOS7, the magnitude of local oscillator leakage scales well with the magnitude of the output power of RFOUT. When an MFDP is disabled, its local version of the local oscillator signal is not generated and is not therefore made to leak through the disabled mixer of the disabled MFDP.

Figures 8, 9:
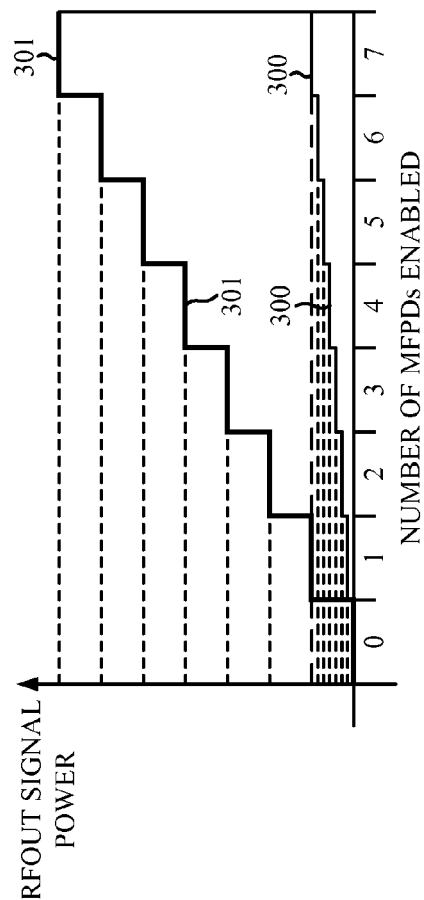
FIG. 8 is a graph that illustrates how the ratio of mixer total output signal power to composite local oscillator signal power remains substantially constant regardless of the number of MFDPs enabled.
FIG. 9 is a table that sets forth approximate comparative performance data for the novel circuit of FIG. 6 and for the prior art circuit of FIG. 3.

FIG. 8 is a chart that illustrates how the magnitude of the power 300 of the local oscillator signal scales in proportion to the magnitude of the output power 301 of the signal RFOUT 118.

FIG. 9 is a table that sets forth approximate comparative performance data for the novel circuit of FIG. 6 and for the prior art circuit of FIG. 3. The character "C" in the quantity "dBC" indicates that the quantity is a power relative to the power of the carrier.

Figure 10:
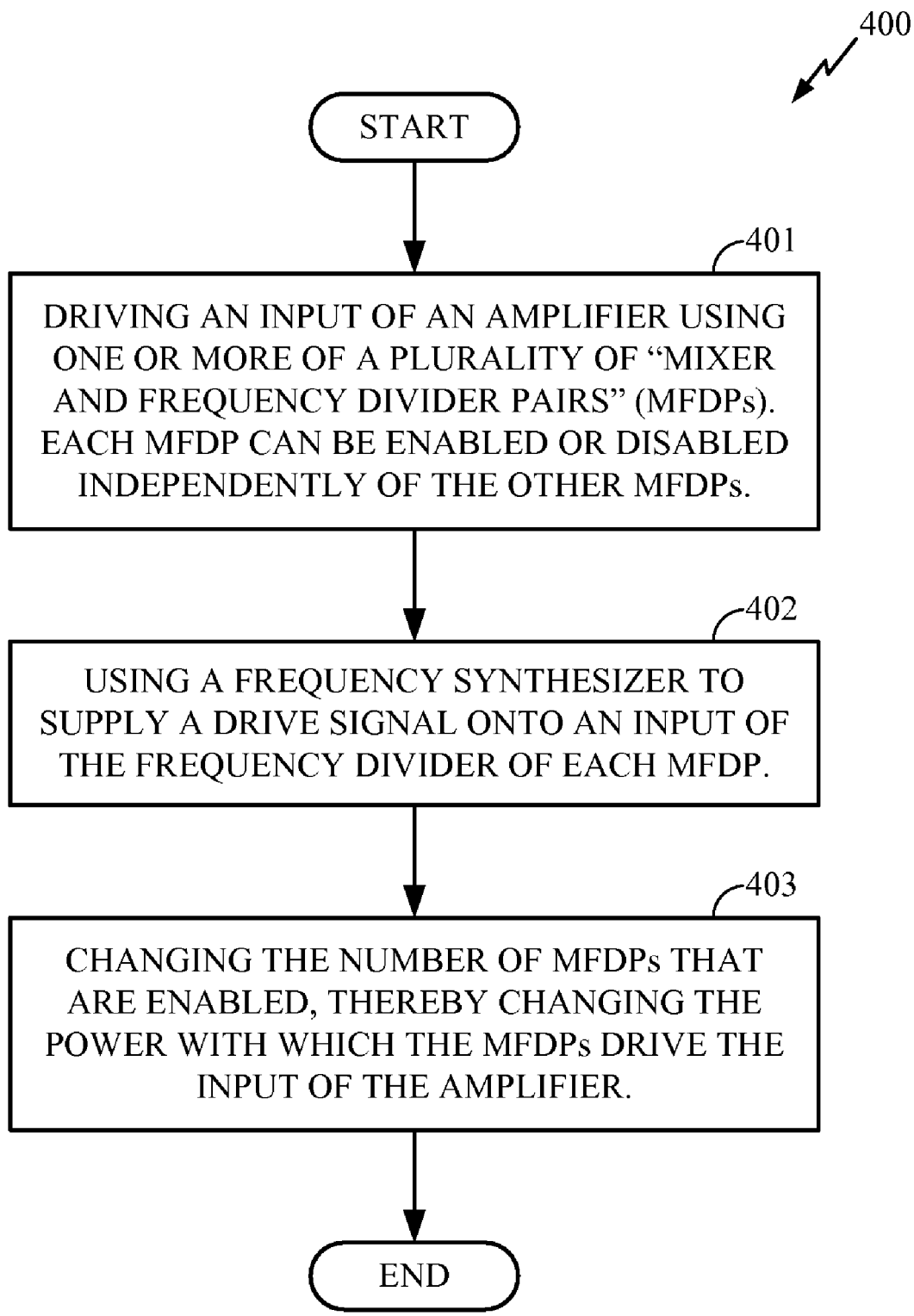
FIG. 10 is a flowchart of a method in accordance with one novel aspect.

FIG. 10 is a flowchart of a method 400 in accordance with one novel aspect. The input of an amplifier (for example, driver amplifier 113) is driven (step 401) using one or more of a plurality of MFDPs. A frequency synthesizer (for example, frequency synthesizer 125) supplies (step 402) a drive signal onto an input of the frequency divider of each MFDP. The number of MFDPs that are enabled is changed (step 403), thereby changing the power with which the MFDPs drive the input of the amplifier. Changing the number of MFDPs that are enabled therefore changes the transmit power of the cellular telephone from one output power step value to another output power step value.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A circuit comprising:
a plurality of mixer and frequency divider pairs (MFDP), wherein each MFDP is configured to receive a baseband signal and a local oscillator signal, wherein each MFDP can be enabled and disabled separately of each other MFDP, wherein the frequency divider of each MFDP supplies a local oscillator signal to the mixer of the MFDP if the MFDP is enabled, wherein the frequency divider of each MFDP does not supply a local oscillator signal to the mixer of the MFDP if the MFDP is disabled, wherein each MFDP has an output lead, and wherein the output leads of all the MFDPs are coupled together; and
a frequency synthesizer adapted to supply a drive signal to the frequency divider of each of the MFDPs.

2. The circuit of claim 1, wherein each MFDP has a first output lead and a second output lead, wherein the first output leads of all the MFDPs are connected together, and wherein the second output leads of all the MFDPs are connected together.

3. The circuit of claim 1, further comprising:
an amplifier, wherein the output leads of the MFDPs are coupled to an input lead of the amplifier through a transformer.

4. The circuit of claim 1, further comprising:
a baseband filter that receives a baseband signal and outputs a plurality of substantially identical versions of the baseband signal, wherein each version of the baseband signal is supplied to the mixer of a corresponding respective one of the MFDPs.

5. The circuit of claim 4, further comprising:
an amplifier, wherein the plurality of MFDPs supplies an input signal to the amplifier, wherein the input signal has a power, and wherein the power of the input signal is adjusted by enabling and disabling selected ones of the plurality of MFDPs.

6. The circuit of claim 5, wherein the frequency divider of each MFDP outputs a local oscillator signal with an output power if said each MFDP is enabled, wherein the sum of all the output powers of all the local oscillator signals has a magnitude, wherein the ratio of the magnitude of the sum of all the local oscillator output powers to the power of the input signal is substantially constant regardless of how many MFDPs are enabled.

7. The circuit of claim 1, wherein each of the MFDPs has a layout, and wherein the layouts of all the MFDPs are substantially identical.

8. The circuit of claim 1, wherein each MFDP has an associated enable input conductor, wherein a first digital logic value on the enable input conductor enables both the mixer and the frequency divider of the MFDP, and wherein a second digital logic value on the enable input conductor disables both the mixer and the frequency divider of the MFDP.

9. The circuit of claim 1, wherein the frequency divider of each MFDP supplies a local oscillator signal with an output power if said MFDP is enabled, wherein the sum of all the output powers of all the local oscillator signals changes in proportion to the number of MFDPs that are enabled.

10. A circuit comprising:
a frequency synthesizer that outputs a drive signal;
a first frequency divider that receives the drive signal from the frequency synthesizer, the first frequency divider outputting a first local oscillator signal if the first frequency divider is enabled;
a first mixer coupled to receive the first local oscillator signal from the first frequency divider and a first baseband signal from a first stage of a baseband filter, wherein if the first frequency divider is enabled then the first mixer is enabled and if the first frequency divider is disabled then the first mixer is disabled;
a second frequency divider that receives the drive signal from the frequency synthesizer, the second frequency divider outputting a second local oscillator signal if the second frequency divider is enabled;
a second mixer coupled to receive the second local oscillator signal from the second frequency divider and a second baseband signal from a second stage of a baseband filter, wherein if the second frequency divider is enabled then the second mixer is enabled and if the second frequency divider is disabled then the second mixer is disabled;
a third frequency divider that receives the drive signal from the frequency synthesizer, the third frequency divider outputting a third local oscillator signal if the third frequency divider is enabled;
a third mixer coupled to receive the third local oscillator signal from the third frequency divider and a third baseband signal from a third stage of a baseband filter, wherein if the third frequency divider is enabled then the third mixer is enabled and if the third frequency divider is disabled then the third mixer is disabled, wherein the frequency of each of the first local oscillator signal, second local oscillator signal and third local oscillator signal are identical; and a driver amplifier, wherein the first, second and third mixers together supply an input signal to the driver amplifier, and wherein the first, second and third mixers can be enabled and disabled independently of one another to change a power with which the input signal drives the driver amplifier.

11. The circuit of claim 10, wherein the circuit has more than three mixers and has more than three frequency dividers, and wherein the circuit is embodied in a cellular telephone.

12. The circuit of claim 11, wherein the first mixer, second mixer, and third mixer have substantially identical layouts, wherein the first frequency divider, the second frequency divider, and the third frequency divider have substantially identical layouts, and wherein the first, second and third mixers and the first, second and third frequency dividers are realized on a single integrated circuit.

13. The circuit of claim 10, wherein the first, second and third local oscillator signals have a combined power, and wherein the ratio of the power with which the input signal drives the driver amplifier to the combined power is substantially constant regardless of how many of the first, second, and third mixers are enabled.

14. A method comprising:
driving an input of an amplifier using one or more of a plurality of mixer and frequency divider pairs (MFDPs), wherein each MFDP has a substantially identical layout, wherein each MFDP receives a baseband signal from a respective stage of a baseband filter and an identical local oscillator signal, and wherein each MFDP can be enabled or disabled independently of an enabling or disabling of the other MFDPs;
using a frequency synthesizer to supply a drive signal onto an input of the frequency divider of each of the MFDPs; and
changing the number of the MFPDs that are enabled and thereby changing a power with which the plurality of MFDPs drives the input of the amplifier.

15. The method of claim 14, wherein the local oscillators of the plurality of MFDPs generate local oscillator signals having a combined power, and wherein the ratio of the power with which the plurality of MFDPs drives the input of the amplifier to the combined power is substantially constant regardless of how many MFDPs are enabled.

16. The method of claim 14, wherein the MFDPs drive the input of the amplifier through a transformer.

17. The method of claim 14, wherein the ratio of local oscillator leakage power to the power with which the plurality of MFDPs drives the input of the amplifier is substantially constant regardless of how many MFDPs are enabled.

18. A radio transmitter circuit comprising:
a baseband filter;
an amplifier taken from the group consisting of: a driver amplifier, and a power amplifier; and
means for receiving a baseband signal from the baseband filter and for driving the amplifier, wherein the means for receiving comprises a plurality of mixer and frequency divider pairs (MFDPs) configured to receive a baseband signal from a respective stage of a baseband filter and an identical local oscillator signal, wherein each of the plurality of MFDPs has a substantially identical layout, and wherein each of the MFDPs can be enabled and disabled independently of the other MFDPs, wherein the means for receiving can be controlled to change an output power with which the means drives the amplifier, wherein a local oscillator leakage signal at the input of the amplifier has a power, and wherein the ratio of the output power to the power of the local oscillator leakage signal is substantially constant as the output power changes.

19. The radio transmitter circuit of claim 18, wherein the means for receiving changes the output power from one of a plurality of discrete output power levels to another selected one of the discrete output power levels, wherein there are at least eight of said discrete output power levels with which the means can be controlled to drive the amplifier.

20. The radio transmitter circuit of claim 18, wherein each MFDP includes a frequency divider, wherein the means for receiving further comprises a frequency synthesizer, and wherein a drive signal output by the frequency synthesizer is supplied to the frequency divider of each of the MFDPs.

21. The radio transmitter circuit of claim 18, wherein the baseband filter, the amplifier, and the means for receiving are disposed on a single integrated circuit, and wherein the integrated circuit is a part of a cellular telephone.

* * * * *